(12) United States Patent
Ivanov et al.

(10) Patent No.: US 6,504,469 B1
(45) Date of Patent: Jan. 7, 2003

(54) MAGNETORESISTIVE ELEMENT AND METHOD OF PRODUCING A CRYSTAL STRUCTURE

(75) Inventors: Zdravko Ivanov, Gothenburg (SE); Tord Claeson, Mölndal (SE); Radoslov Chakalov, Gothenburg (SE); Erland Wikborg, Danderyd (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/532,467

(22) Filed: Mar. 22, 2000

(30) Foreign Application Priority Data

Mar. 22, 1999 (SE) .............................................. 9901041

(51) Int. Cl.$^7$ ..................... H01L 43/00; H01L 43/02; H01L 43/04; H01L 43/06; H01L 43/08; H01L 43/10
(52) U.S. Cl. ................... 338/32 R; 360/113; 360/260; 324/207.21; 428/682
(58) Field of Search .................. 338/32 R; 360/113, 360/126; 428/682, 684 T, 684 R, 692, 693, 701; 324/207.21, 249

(56) References Cited

U.S. PATENT DOCUMENTS

| | | | | |
|---|---|---|---|---|
| 5,872,502 A | * | 2/1999 | Fujikata et al. | 338/32 R |
| 5,874,886 A | * | 2/1999 | Akari et al. | 338/32 R |
| 5,894,385 A | * | 4/1999 | Gill et al. | 360/113 |
| 5,966,272 A | * | 10/1999 | Cain | 360/113 |
| 6,004,654 A | * | 12/1999 | Shinjo et al. | 428/161 |
| 6,054,226 A | * | 4/2000 | Takeda et al. | 428/682 |

OTHER PUBLICATIONS

Milton Ohring, The Materials Science of Thin Films, 1992, Academic Press, Inc. pp 10–11.*

* cited by examiner

Primary Examiner—Elvin Enad
Assistant Examiner—Kyung Lee
(74) Attorney, Agent, or Firm—Burns, Doane, Swecker & Mathis, L.L.P.

(57) ABSTRACT

A magnetoresistive element, comprising a crystal structure with a grain boundary formed at a misorientation angle, and a method of producing a crystal structure having colossal magnetoresistance, wherein a grain boundary is formed at a misorientation angle. The crystal structure comprises a substrate layer and a CMR film layer epitaxially grown thereon, the CMR film layer having a plurality of first sections and a plurality of second sections with intermediate grain boundaries, the crystallographic axis of the first sections being different from the crystallographic axis of the second sections. The method comprises forming, on a base crystal material, a template comprising a first set of sections and a second set of sections with intermediate boundaries, the crystallographic axis of the first set being different from the crystallographic axis of the second set, and growing a film epitaxially on the base crystal material to form a plurality of grain boundaries over the boundaries between the first set and the second set.

7 Claims, 2 Drawing Sheets

MAGNETORESISTIVE ELEMENT AND METHOD OF PRODUCING A CRYSTAL STRUCTURE

BACKGROUND

The invention relates to a structure having colossal magnetoresistive (CMR) properties, a method for producing such a structure and a device comprising a structure having colossal magnetoresistive properties.

Thin films having CMR properties are generally considered to have a high potential for application in e.g. reading heads of devices for magnetic storage of information. It has been revealed that this effect originates from the properties of grain boundaries. CMR has been observed in many perovskite ferromagnets.

STATE OF THE ART

Normally the employed magnetic fields are high, around 5 T. By use of such magnetic fields there can be a change of resistance of 80%. For a viable use of these materials in the information technology, CMR should occur on the application of small fields (0,1 T or less), Research has been made on boundary-containing media, such as polycristalline and textured thin films, trilayer tunnel junctions, bridges on bicrystal substrates and ramp-edge junctions. It is possible to grow films on bicrystal substrates and to etch a bridge across the boundary, see for instance the document Applied Physics Letters, Volume 72, Number 16, "Magnetoresistance of artificial $La_{0.7}Sr_{0.3}MnO_3$ grain boundaries as a function of misorientation angle", S. P. Isaac, et al.

This document discloses a method of growing films on bicrystal substrates to form a single, well-controlled grain boundary at a specific misorientation angle at a known angle with respect to the chip. On either side of the bicrystal divide, the films grow epitaxially forming an artificial grain boundary across the centre of the chip. The films are patterned into a geometry with two sets of two identical arms. Two arms are centred on the substrate grain boundary. The highest values of the magnetoresistance have been obtained for a grain boundary with a misorientation angle of 45°. A drawback of bicrystal substrates is the limitation of the number of the bridges, which can be patterned on the boundary.

Furthermore, if single crystals are used instead of bicrystals, grain boundaries are produced in an uncontrolled manner, i.e. a polycrystalline film is obtained which is uncontrollably formed since the grains will have arbitrary sizes as well as orientations.

SUMMARY

An object of the present invention is to overcome the drawback of prior art and to provide a magnetoresistive element and a method of producing a crystal structure having colossal magnetoresistance which is controllable.

A template is formed on a base crystal substrate material. The template exhibits different sections in which the crystallographic axis, or orientation, of a first section is different from the crystallographic axis, or orientation, of a second section. A colossal magnetoresistive film (CMR) is grown on the base crystal. Due to the different orientations, or misorientation, there will be a lattice misfit between the sections. A grain boundary is formed in the CMR film over the boundaries between the sections. The properties of the grain boundaries highly affect the magnetoresistive characteristics.

A large number of small islands can be patterned in the substrate, or in a seed layer deposited on the substrate, forming a template with an orientation different from that of the substrate. When a CMR film is grown epitaxially on such a surface, many grain boundaries will appear over the boundaries between the substrate template and the seed layer template. Their number can be controlled by varying the size and orientation of the templates. The grain boundary misorientation angle can be controlled by varying the material of the seed layer and the orientation of the template.

The in-plane orientation of a magnetoresistive film depends on the seed layer that is deposited on the substrate. There are seed layers on which CMR grows with the same in-plane orientation (cube-on-cube), e.g. $SrTiO_3$, while on other seed layers the orientation of the deposited CMR film is rotated by some angle with respect to the substrate axis. As a result artificial grain boundaries are introduced in the CMR film. A large number of small islands can be patterned from a template in the seed layer to create sections with an in-plane orientation different from that of the substrate. The number of the grain boundaries inherited in the deposited CMR film depends on the size of the template element.

It is also possible to form magnetoresistive films that are formed by a template with sections having different out-of-plane orientation. When a CMR film is grown on a step in a substrate, one or several grain boundaries are formed over the step. If sections or islands are patterned in the substrate and a CMR film then is grown epitaxially, the grain boundaries that are created over the steps separate the CMR film into a two dimensional array of epitaxially grown areas with the same in-plane orientation. The number of grain boundaries depends on the substrate material, step angle and step height.

Preferably a single crystal substrate is used.

BRIEF DESCRIPTION OF THE DRAWINGS

The invention will in the following be further described in a non-limiting way and with reference to the accompanying drawings, in which.

DETAILED DESCRIPTION OF THE INVENTION

Figure 1A:
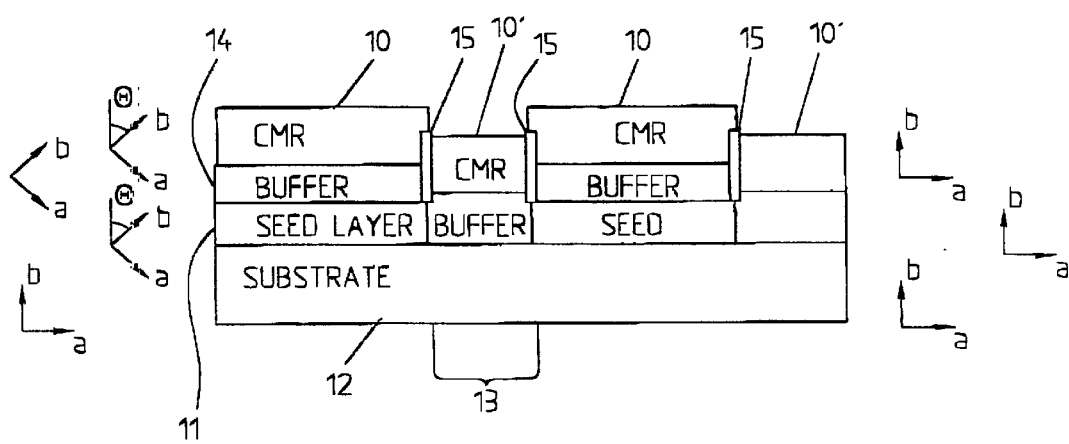
FIG. 1A is a schematic presentation of a first embodiment of a structure according to the invention with in-plane orientation of different layers.
Figure 3:
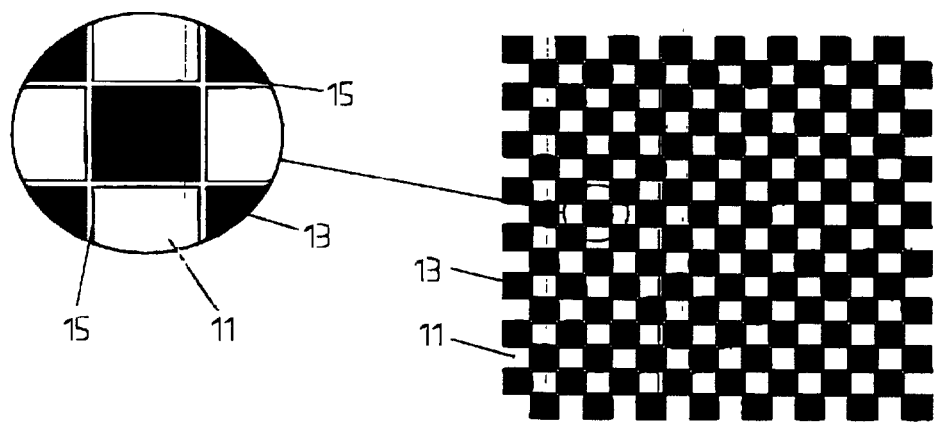
FIG. 3 is a schematic presentation showing a chess board pattern that is used on a structure to create a plurality of boundaries.

The embodiment shown in FIG. 1A is based on the fact that in-plane orientation of a magnetoresistive film 10 depends on a seed layer 11 that is deposited on a substrate 12. The substrate can be formed by $SrTiO_3$ or a material having similar properties. Some sections 13 of the substrate 12 are not covered by a seed layer 11, and a suitable pattern with sections covered by the seed layer 11 and adjacent sections not covered by the seed layer is formed. Such sections can be achieved by etching the seed layer 11. A suitable pattern is shown in FIG. 3. The seed layer can be formed by MgO or a material having similar properties. After creating the pattern a buffer layer 14 is applied over the complete substrate surface area. The buffer layer 14 can be formed by $CeO_2$, CeO or a material having similar properties.

Finally, first sections 10 of a CMR layer are grown on the buffer layer 14 over the seed layer, and second sections 10' of a CMR layer are grown on the buffer layer 14 over parts of the substrate lacking the seed layer. The complete CMR layer can be formed by $La_{0.7}Sr_{0.3}MnO_3$ or a material having similar properties. Grains can be formed in a highly-oriented CMR thin film by controlling their in-plane epitaxy by using seed and buffer layers, in accordance with a method called "biepitaxy". The method is based on the property of the film crystal lattice to grow aligned to the edge of the substrate crystal lattice in the case of $a_{SUBSTRATE} \approx a_{FILM}$ or aligned to the diagonal in the case of $a_{SUBSTRATE} \approx \sqrt{2} \times a_{FILM}$. Thus, by local variation of the substrate/layer cell parameter $a_{SUBSTRATE}$, grains with different in-plane orientation could be created in an epitaxial CMR film. A misorientation angle at the boundaries between them will be 45°.

The orientation in the first sections 10 is different from the orientation in the second sections 10' and grain boundaries 15 are formed in the intersections. The change of orientation between the different layers may vary depending on the materials chosen for substrate, seed, buffer and CMR Preferably, the misorientation angle θ at the boundaries between the layers is 45°. Other misorientation angles will cause a lower magnetic field dependency.

As shown to the left in FIG. 1A there is a misorientation of θ between the substrate layer and the seed layer. No misorientation will appear between the buffer layer and the seed layer or between the buffer layer and the CMR layer. Where there is no seed layer, as shown to the right in FIG. 1A there is no misorientation at all between any of the layers. As a result there will be formed grain boundaries 15 in the intersections.

Figure 1B:
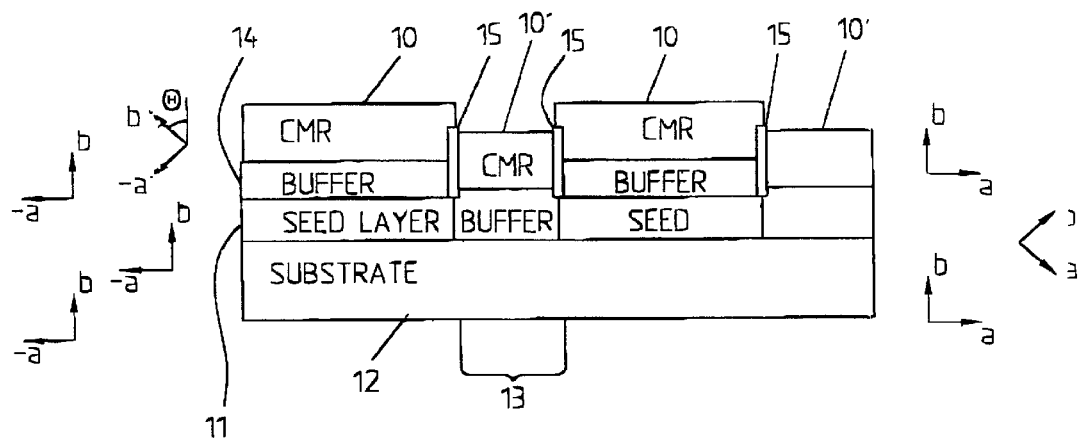
FIG. 1B is a schematic presentation of an alternative implementation of structure according to FIG. 1A.

In the embodiment shown in FIG. 1B the structure is formed in the same way as in FIG 1A. However, the materials chosen in this embodiment will result in different change of orientation between the layers. The orientation of the seed layer will follow the orientation of the substrate as shown to the left in FIG. 1B. The orientation of the buffer layer follows the seed layer but will rotate a misorientation angle of when formed directly on the substrate, as shown at the right in FIG. 1A. Then the CMR layer will rotate a misorientation angle when formed on the buffer layer, irrespective of the presence of a seed layer. Thus the total misorientation from the substrate layer to the CMR layer will be θ where there is a seed layer, while there will be no resulting misorientation where there is no seed layer.

The different layers of the structure in FIG. 1A and FIG. 1B are very thin. In one embodiment the substrate 12 is formed by $SrTiO_3$ of a=3,905 Å. The seed layer 11 is formed by MgO of a=4,21 Å, and the buffer layer 14 is formed by $CeO_2$ of a=5,41 Å. The CMR layer 10, 10' is formed by $La_{0.7}Sr_{0.3}MnO_3$ of a=3,82 Å.

Figure 2:
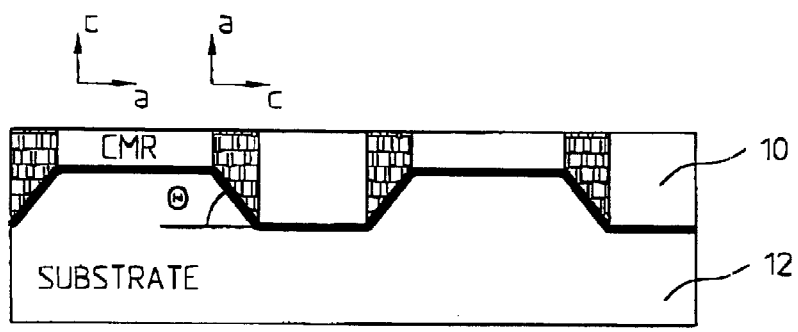
FIG. 2 is a schematic presentation of a second embodiment of a structure according to the invention with out-of-plane orientation of different sectors.

It is possible also to grow a CMR film on a step in a substrate as shown in FIG. 2. One or several grain boundaries will be formed over the step. Islands or similar sections are formed in the substrate 12 and a CMR film is grown epitaxially thereon. The grain boundaries created over the steps separate the CMR film into a two dimensional array of epitaxially grown areas with the same in-plane orientation. The number of grain boundaries depends on the substrate material, the step angle and the step height. The step angle θ should be over 20°, preferable over 30°.

FIG. 3 shows one example of a template that can be used to create a plurality of fields. A thin seed layer 11 is deposited on the whole area of the substrate 12 Then the seed layer 11 is etched into a chess-board pattern. The chess-board fields where the substrate surface is disclosed initiate in-plate rotated growth of both the buffer layer and the CMR film. On the neighboring fields, which are covered by the seed layer, there is no rotation of the buffer layer but the CMR film only. Thus, domains with different in-plane orientation are created in the CMR film and a two dimensional array of grain boundaries is well defined. The size of the domains are readily varied by changing the dimensions of the fields. Also other templates or patterns can be used. The pattern should exhibit areas with different orientation and intermediate boundaries, for instance crossing lines, differently shaped islands or mesh structures. It would be possible also to form arrays of lines having series of grain boundaries.

The films can be deposited by laser ablation of ceramic targets with the corresponding compositions under the following conditions: KrF excimer laser irradiation with 248 nm wavelength and 1,5 $J/cm^2$ energy density, substrate temperature of 760° C., oxygen pressure of 0,8 mbar, slow cooling down to room temperature (20°/min: in 1 atm oxygen. After deposition of 20 nm seed layer (MgO), the seed layer was patterned into a chess-board pattern, each field sized to 8 μm×8 μm. The substrate ($SrTiO_3$) size is 5 mm×5 mm and the whole pattern occupies an area of 4 mm×4 mm. A conventional photolithography and ion-beam etching with argon ions (500 eV and 0,2 $mA/cm^2$) are used for forming the pattern.

The sample again can be mounted in the vacuum chamber and an "in-situ" annealing can be performed for 1 h in 1 atm $O_2$ at 760° C. to recover a possible surface disorder due to the ion-beam bombardment. Then the buffer 14 ($CeO_2$) and CMR 10, 10' ($La_{0.7}Sr_{0.3}MnO_3$) thin films are deposited without opening the chamber, although slow cooling down in 1 atm oxygen to room temperature can be made after the ablation of each target. Finally, the CMR 10, 10' film is removed partially from the areas outside the chess-board pattern and connections are made for external circuitry.

Figure 4:
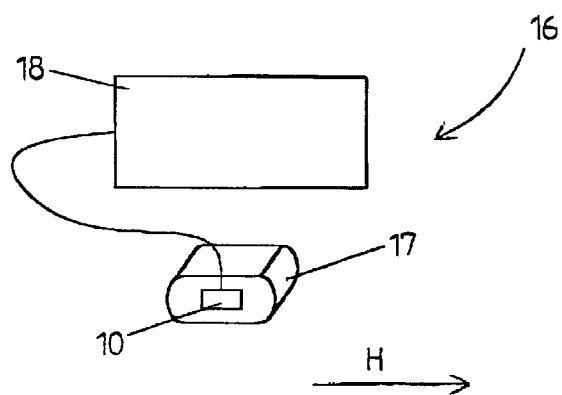
FIG. 4 is a schematic view of a magnetic field sensing device incorporating the inventive structure.

One embodiment of the structure according to the invention is shown schematically in FIG. 4. A magnetic field sensing device 16 comprises a sensing head 17 supporting a magnetoresistive element with a magnetoresistive film 10. A magnetic field H applied to the sensing device 16 will change the resistance of said film 10. The magnetoresistive film 10 is operatively connected to an electronic unit 18 sensing variations of the resistance of the magnetoresistive film 10 in dependence of the applied magnetic field M. The magnetic field H may have its origin in magnetic storage means, such as hard discs, or in other magnetic sources.

What is claimed is:

1. A magnetoresistive element comprising a crystal structure with a grain boundary formed at a misorientation angle, wherein the crystal structure comprises a substrate layer and a film layer epitaxially grown thereon, said film layer comprising a perovskite ferromagnetic thin film material having CMR properties, the film layer having a plurality of first sections and a plurality of second sections with intermediate boundaries, said second section further including a seed layer deposited on the substrate layer and selected to predetermine the misorientation angle, the crystallographic axis of the first sections being different from the crystallographic axis of the second sections, and the boundaries comprise grain boundaries, wherein a magnetoresistive response of the element depends on the grain boundaries.

2. An element according to claim 1, wherein:
the substrate comprises single crystals.

3. A device for sensing magnetic signals comprising a crystal structure with a grain boundary formed at a misorientation angle, wherein:

the crystal structure comprises a substrate layer and a film layer epitaxially grown thereon, said film layer comprising a perovskite ferromagnetic thin film material having CMR properties, the film layer having a plurality of first sections and a plurality of second sections with intermediate boundaries, the crystallographic axis of the first sections being different from the crystallographic axis of the second sections, said second section further including a seed layer deposited on the substrate layer and selected to predetermine the misorientation angle;

the boundaries comprise grain boundaries, wherein a magnetoresistive response of the device depends on the grain boundaries; and the crystal structure is operatively connected to an electronic unit for sensing variations in the resistance of the structure in dependence on a magnetic field acting on the substrate.

4. A magnetoresistive element, comprising:

a substrate layer formed from a material having a crystal structure oriented along a first crystallographic axis;

a seed layer covering portions of the substrate, wherein the seed layer is formed from a material having a crystal structure oriented along a second crystallographic axis that differs from the first crystallographic axis by a misorientation angle, θ, the seed layer selected to predetermine the misorientation angle;

a buffer layer covering the substrate layer and the seed layer;

a film layer covering the buffer layer, said film layer comprising a perovskite ferromagnetic thin film material having CMR properties, wherein a magnetoresistive response of the element depends on the grain boundaries.

5. A magnetoresistive element according to claim 4, wherein:

the buffer layer is formed from a material having a crystal structure that matches the substrate layer and the seed layer, such that the buffer layer includes a plurality of sections having a crystal structure oriented along the first crystallographic axis and a plurality of sections having a crystal structure oriented along the second crystallographic axis.

6. A magnetoresistive element according to claim 5, wherein:

the magnetoresistive layer is formed from a material having a crystal structure that matches the buffer layer, such that the magnetoresistive layer includes a plurality of sections having a crystal structure oriented along the first crystallographic axis and a plurality of sections having a crystal structure oriented along the second crystallographic axis.

7. A magnetoresistive element according to claim 5, wherein:

the magnetoresistive layer is formed from a material having a crystal structure that differs from the crystal structure of the buffer layer by a misorientation angle, θ, such that the magnetoresistive layer includes a plurality of sections having a crystal structure oriented along the first crystallographic axis and a plurality of sections having a crystal structure oriented along the second crystallographic axis.

* * * * *